United States Patent
Feldman et al.

(10) Patent No.: US 10,267,880 B2
(45) Date of Patent: Apr. 23, 2019

(54) METHODS FOR PRODUCING A PULSE-PAIR FOR MAGNETIC RESONANCE IMAGING AND DEVICES THEREOF

(71) Applicant: Icahn School of Medicine at Mount Sinai, New York, NY (US)

(72) Inventors: Rebecca Emily Feldman, New York, NY (US); Haisam Mohammad Islam, Stanford, CA (US); Priti Balchandani, New York, NY (US)

(73) Assignee: Icahn School of Medicine at Mount Sinai, New York, NY (US)

( * ) Notice: Subject to any disclaimer, the term of this patent is extended or adjusted under 35 U.S.C. 154(b) by 905 days.

(21) Appl. No.: 14/697,040

(22) Filed: Apr. 27, 2015

(65) Prior Publication Data

US 2016/0116561 A1    Apr. 28, 2016

Related U.S. Application Data

(60) Provisional application No. 62/112,802, filed on Feb. 6, 2015, provisional application No. 61/984,067, filed on Apr. 25, 2014.

(51) Int. Cl.
| | |
|---|---|
| *G01R 33/483* | (2006.01) |
| *G01R 33/58* | (2006.01) |
| *G01R 33/28* | (2006.01) |
| *G01R 33/48* | (2006.01) |
| *G01R 33/563* | (2006.01) |
| *G01R 33/565* | (2006.01) |

(52) U.S. Cl.
CPC ........ *G01R 33/4835* (2013.01); *G01R 33/288* (2013.01); *G01R 33/4806* (2013.01); *G01R 33/5659* (2013.01); *G01R 33/56341* (2013.01); *G01R 33/58* (2013.01)

(58) Field of Classification Search
CPC .................................................... G01R 3/4835
See application file for complete search history.

(56) References Cited

U.S. PATENT DOCUMENTS

| | | | | |
|---|---|---|---|---|
| 5,327,087 A | * | 7/1994 | Hafner | G01R 33/4816 324/307 |
| 6,031,375 A | * | 2/2000 | Atalar | G01R 33/285 324/307 |
| 6,133,735 A | * | 10/2000 | Hurlimann | G01N 24/081 324/300 |

(Continued)

OTHER PUBLICATIONS

Schick, "Whole-body MRI at high field: technical limits and clinical potential," Eur. Radiol. 15(5):946-59 (2005).

(Continued)

*Primary Examiner* — Dixomara Vargas
(74) *Attorney, Agent, or Firm* — Bryan C. Smith

(57) ABSTRACT

A method, magnetic resonance imaging computing device, and a non-transitory computer readable medium for producing a pulse pair for magnetic resonance imaging. A pulse pair control signal comprising an adiabatic pulse and a matched phase non-adiabatic pulse is generated. The pulse pair control signal is transformed into a power independent of number of slices pulse pair. The Power Independent of Number of Slices pulse pair control signal is output to a waveform generator to produce the Power Independent of Number of Slices pulse pair in a spin echo sequence.

36 Claims, 8 Drawing Sheets

(56) References Cited

U.S. PATENT DOCUMENTS

| | | | | |
|---|---|---|---|---|
| 8,473,536 | B2* | 6/2013 | Balchandani | G01R 33/44 708/131 |
| 8,797,031 | B2* | 8/2014 | Rehwald | G01R 33/5602 324/309 |
| 9,891,300 | B2* | 2/2018 | Mugler | G01R 33/4824 |
| 2010/0325185 | A1* | 12/2010 | Balchandani | G01R 33/44 708/403 |
| 2017/0160361 | A1* | 6/2017 | Feldman | G01R 33/4833 |

OTHER PUBLICATIONS

Ugurbil et al., "Ultrahigh Field Magnetic Resonance Imaging and Spectroscopy," Magn. Reson. Imaging 12:1263-81 (2003).

Lee et al., "Defining Multiple Sclerosis Disease Activity using MRI T2-Weighted Difference Imaging" Brain 121 (Pt. 11):2095-102 (1998).

Oh et al., "Quantitative Apparent Diffusion Coefficients and T2 Relaxation Times in Characterizing Contrast Enhancing Brain Tumors and Regions of Peritumoral Edema," J. Magn. Reson. Imaging 21(6):701-8 (2005).

Woermann et al., "A Fast Flair Dual-Echo Technique for Hippocampal T2 Relaxometry: First Experiences in Patients with Temporal Lobe Epilepsy," 13(4):547-52 (2001).

Duong et al., "High-Resolution, Spin-Echo BOLD, and CBF fMRI at 4 and 7 T," Magn. Reson. Med. 48(4):589-93 (2002).

Larkman et al., "Use of Multicoil Arrays for Separation of Signal from Multiple Slices Simultaneously Excited," J. Magn. Reson. Imaging 13(2):313-7 (2001).

Koopmans et al., "Simultaneous Multislice Inversion Contrast Imaging Using Power Independent of the Number of Slices (PINS) and Delays Alternating with Nutation for Tailored Excitation (DANTE) Radio Frequency Pulses," Magn. Reson. Med. 69(6):1670-6 (2013).

Pauly et al., "Parameter Relations for the Shinnar-Le Roux Selective Excitation Pulse Design Algorithm [NMR imaging]," IEEE Trans. Med. Imaging 10(1):53-65 (1991).

Balchandani et al., "Self-Refocused Adiabatic Pulse for Spin Echo Imaging at 7 T," Magn. Reson. Med. 67(4):1077-85 (2012).

Balchandani et al., Designing Adiabatic Radio Frequency Pulses Using the Shinnar-Le Roux Algorithm, Magn. Reson. Med. 64(3):843-51 (2010).

Feinberg et al., "Ultra-fast MRI of the Human Brain with Simultaneous Multi-Slice Imaging," J Magn. Reson. 229:90-100 (2013).

Norris et al., "Power Independent of Number of Slices (PINS) Radiofrequency Pulses for low-power Simultaneous Multislice Excitation," Magn. Reson. Med. 66(5):1234-40 (2011).

Markl et al., "Gradient Echo Imaging," J Magn. Reson. Imaging 35(6):1274-89 (2012).

Norris, "High Field Human Imaging," J Magn. Reson. Imaging 18:519-529 (2003).

* cited by examiner

METHODS FOR PRODUCING A PULSE-PAIR FOR MAGNETIC RESONANCE IMAGING AND DEVICES THEREOF

CROSS-REFERENCE TO RELATED APPLICATIONS

This application claims the benefit of U.S. Provisional Patent Application Ser. No. 62/112,802 filed Feb. 6, 2015 and U.S. Provisional Patent Application Ser. No. 61/984,067 filed Apr. 25, 2014, which are herein incorporated by reference in their entirety.

This invention was made with government support under grant numbers NS070821 and EB015891 awarded by the National Institutes of Health. The government has certain rights in this invention.

FIELD

This technology generally relates to methods and devices for magnetic resonance imaging and, more particularly, to methods and devices for producing a semi-adiabatic matched phase spin echo power independent of number of slices pulse pair.

BACKGROUND

Simultaneous multi-slice (SMS) imaging using multiband (MB) excitation and parallel imaging is a powerful technique that can reduce magnetic resonance image acquisition time for anatomical, functional, and diffusion weighted magnetic resonance imaging. SMS imaging is achieved by simultaneously exciting several slices in the region of interest (ROI). With the use of multiple receiver coil channels, the sensitivity profiles of the coils are used to disentangle the slices during reconstruction.

Magnetic resonance imaging (MRI) at high magnetic fields, such as seven Tesla (7T), offers increased signal-to-noise ratio (SNR) and enhanced contrast when compared to conventional field strengths. This increased SNR can be parlayed into unprecedented spatial resolution or faster acquisitions for structural, functional, and spectroscopic imaging sequences. Spin echo preparations are often used for diffusion-weighted imaging and may also be useful for functional MRI at high magnetic fields. However, spin echo imaging at 7T and above faces several challenges that must be overcome in order to capitalize on the potential advantages. Three of these issues are: 1) increased inhomogeneity in the applied radiofrequency (RF) field (B1 field) leading to non-uniformities in signal and contrast when using conventional RF pulses; 2) increased RF power deposition in tissue, as measured by the specific absorption rate (SAR), limiting the strength and number of RF pulses in sequences; and 3) changes in characteristic T1 and T2 tissue relaxation parameters that affect sequence timing and image contrast.

One method of creating multi-slice excitations uses RF pulses with slice profiles that are spatially shifted off-center through a sinusoidal modulation of the wave form. The complex summation of these individual component RF pulses, with shifted spatial slice profiles, results in a single composite MB RF pulse. However, the RF power deposition of this type of MB pulse increases with the number of slices. Due to the quadratic increase of power deposition with field strength, the number of slices achievable by the conventional SMS technique at 7T is restricted by transmitter B1 peak power and SAR safety limits. Furthermore, conventional MB composite pulses, particularly 180° MB pulses used in spin echo SMS sequences, are susceptible to slice amplitude and profile attenuation due to the significant B1 field variation at 7T.

An alternative multi-slice pulse design method, the Power Independent of the Number of Slices (PINS) technique, may be used to produce pulses that excite multiple discrete slices simultaneously, without increasing power deposition above that required for a single slice excitation. This is accomplished by interleaving the single-slice RF waveform, modulated with a comb function, with a gradient pulse train. The RF pulse used as the basis for the PINS pulse can be designed to provide the desired bandwidth (BW) and duration.

The PINS technique has been applied to adiabatic VERSE-DANTE pulses to help combat the effect of B1 inhomogeneity. However, adiabatic pulses generate quadratic phase across the selected slice profile and, in a typical spin echo sequence, a linear phase across the slice can only be achieved through the application of a second, identical adiabatic RF pulse. This twice-refocused approach permits the use of adiabatic pulses in a spin echo sequence, but at the cost of increased echo time (TE) and SAR.

SUMMARY

A method for producing a pulse pair for magnetic resonance imaging includes generating, by a magnetic resonance imaging computing device, a pulse pair control signal comprising an adiabatic pulse and a matched phase non-adiabatic pulse. The pulse pair control signal is transformed into a Power Independent of the Number of Slices pulse pair control signal. The Power Independent of the Number of Slices pulse pair control signal is output to a waveform generator to produce the Power Independent of the Number of Slices pulse pair in a spin echo sequence.

A magnetic resonance imaging computing device includes at least one processor and a memory coupled to the processor which is configured to be capable of executing programmed instructions comprising and stored in the memory to generate a pulse pair control signal comprising an adiabatic pulse and a matched phase non-adiabatic pulse. The pulse pair control signal is transformed into a Power Independent of the Number of Slices pulse pair control signal. The Power Independent of the Number of Slices pulse pair control signal is output to a waveform generator to produce the power independent of number of slices pulse pair in a spin echo sequence.

A non-transitory computer readable medium having stored thereon instructions for producing a pulse pair for magnetic resonance imaging comprises executable code which when executed by a processor, causes the processor to perform steps including generating a pulse pair control signal comprising an adiabatic pulse and a matched phase non-adiabatic pulse. The pulse pair control signal is transformed into a Power Independent of the Number of Slices pulse pair control signal. The Power Independent of the Number of Slices pulse pair control signal is output to a waveform generator to produce the power independent of number of slices pulse pair in a spin echo sequence.

This technology provides a number of advantages including providing more effective methods and devices for producing a pulse pair for magnetic resonance imaging. This exemplary method utilizes a SEAMS PINS pulse pair control signal including matched-phase adiabatic Shinnar Le-Roux (SLR) pulses to generate a multi-slice spin echo. The SEAMS PINS pulse sequence advantageously provides improved B1-immunity when compared to a traditional spin echo sequence. In one example, the quadratic phase deposited by an adiabatic 180° SLR pulse is refocused by a 90° pulse, obviating the need for a second adiabatic 180° pulse and therefore, advantageously providing a lower-SAR, shorter echo-time solution than a twice-refocused adiabatic pulse sequence. The number of slices, slice thickness, and separation of slices are fully adjustable through changes in sampling frequency and/or gradient moment. This technique may advantageously be applied in vivo to accelerate any spin echo sequence, including those used for structural imaging, diffusion weighted imaging, and functional imaging, while providing improved immunity to B1-inhomogeneity.

BRIEF DESCRIPTION OF THE FIGURES

FIG. 8F illustrates low-resolution reference images obtained to estimate the coil sensitivity profile.

DETAILED DESCRIPTION

Figure 1:
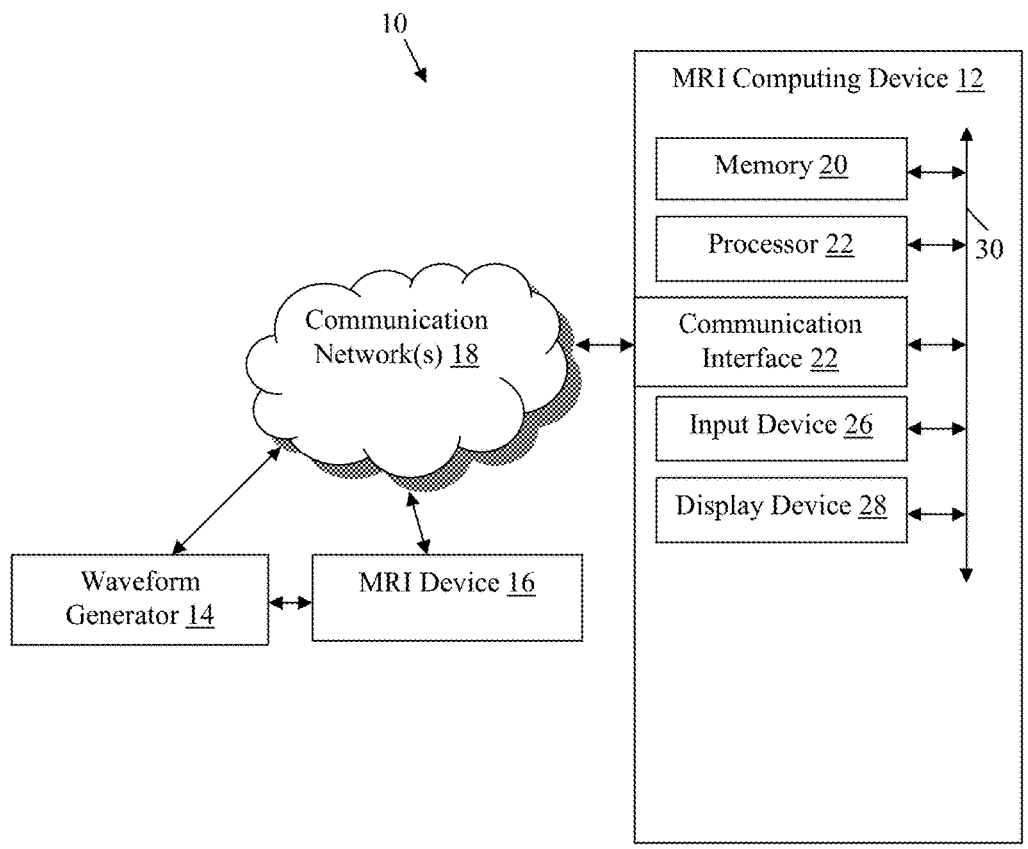
FIG. 1 is an exemplary environment including a magnetic resonance imaging computing device of the present technology.

An exemplary environment 10 including a magnetic resonance imaging (MRI) computing device 12 coupled to a wave generator 14, which is in communication with a MRI device 16, by communication network(s) 18 is illustrated in FIG. 1. While not shown, the environment also may include additional components which are well known to those of ordinary skill in the art of magnetic resonance imaging and thus will not be described here. This technology provides a number of advantages including methods, non-transitory computer readable media, and devices that more effectively generate pulse pairs for spin echo magnetic resonance imaging.

Referring more specifically to FIG. 1, the MRI computing device 12 in this example is configured to be capable of providing a pulse pair control signal to produce a pulse pair sequence in accordance with the methods described herein. The MRI computing device 12 includes at least a processor 20, a memory 22, a communication interface 24, an input device 26, and a display device 28, which are coupled together by a bus 30 or other communication link, although other numbers and types of systems, devices, components, and elements in other configurations and locations can be used.

The processor 20 in the MRI computing device 12 executes a program of instructions stored in the memory for one or more aspects of the present technology, although other numbers and types of systems, devices, components, and elements in other configurations and locations can be used. The communication interface 24 of the MRI computing device 12 is used to operatively couple and communicate between the MRI computing device 12 and the waveform generator via a communication link, although the communications network(s) could also be used in other examples and other types and numbers of communication networks or systems with other types and numbers of connections and configurations can be used.

The memory 22 in the magnetic resonance imaging computing device stores these programmed instructions for one or more aspects of the present technology, although some or all of the programmed instructions could be stored and/or executed elsewhere. A variety of different types of memory storage devices, such as a random access memory (RAM), read only memory (ROM), hard disk, CD ROM, DVD ROM, or other computer readable medium which is read from and written to by a magnetic, optical, or other reading and writing system that is coupled to the processor 20, can be used for the memory 22.

The communication interface 24 of the MRI computing device 12 is used to operatively couple and communicate between the MRI computing device 12 and the waveform generator 14 and MRI device 16 via the communications network(s) 18, although other types and numbers of communication networks or systems with other types and numbers of connections and configurations can be used. By way of example only, the communications network could use TCP/IP over Ethernet and industry-standard protocols, including NFS, CIFS, SOAP, XML, LDAP, and SNMP, although other types and numbers of communication networks, such as a direct connection, a local area network, a wide area network, modems and phone lines, e-mail, and wireless communication technology, each having their own communications protocols, can be used.

The input 26 and display devices 28 of the MRI computing device 12 enable a user to interact with the MRI computing device 12, such as to input and/or view data and/or to configure, program, and/or operate the MRI computing device 12 by way of example only. The input device 26 may include a keyboard, computer mouse, and/or touch screen and the display device 28 may include a computer monitor, although other types and numbers of input devices and/or display devices could also be used in other examples.

The waveform generator 14 is a standard waveform generator capable of producing radiofrequency pulses in accordance with the methods of the present technology. The MRI device 16 is a standard magnetic resonance imaging device, such as, by way of example only a 7T actively shielded whole body MRI scanner (Siemens MAGNETOM 7T, Siemens, Erlangen), equipped with a SC72CD gradient coil (Gmax=70 mT/m and max slew rate=200 T/m/s), using a single channel transmitter and a 32-channel receive head coil (Nova Medical, Wilmington, Mass.).

Although examples of the MRI computing device 12, waveform generator 14, and MRI device 16 are described herein, each of these systems can be implemented on any suitable computer system or computing device. It is to be understood that the devices and systems of the examples described herein are for exemplary purposes, as many variations of the specific hardware and software used to implement the examples are possible, as will be appreciated by those skilled in the relevant art(s).

The examples may also be embodied as a non-transitory computer readable medium having instructions stored thereon for one or more aspects of the present technology as described and illustrated by way of the examples herein, as described herein, which when executed by a processor, cause the processor to carry out the steps necessary to implement the methods of the examples, as described and illustrated herein.

Exemplary methods, non-transitory computer readable medium, and devices for producing a pulse pair in accordance with the present technology will now be described herein.

Figure 2:
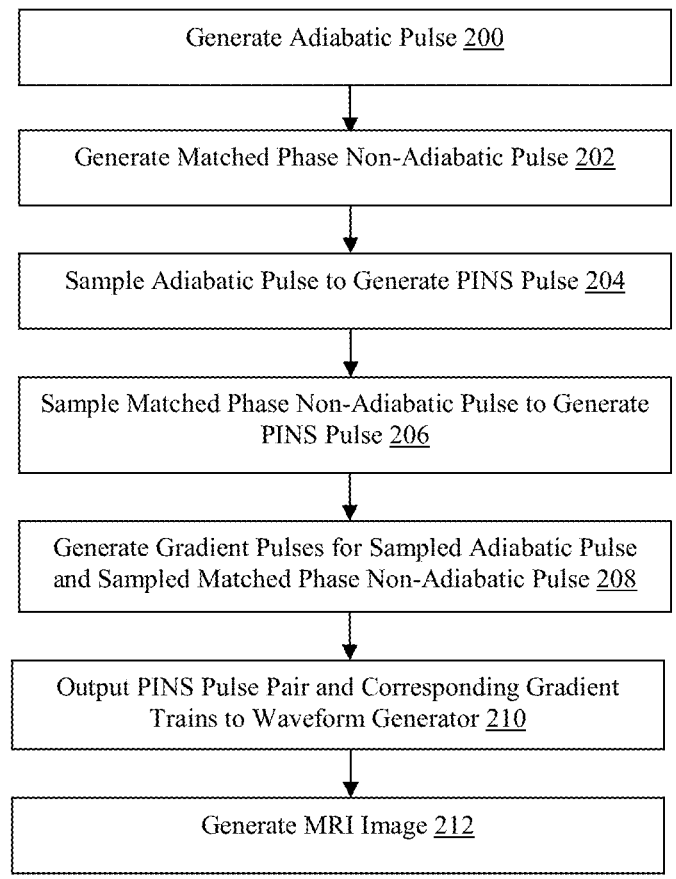
FIG. 2 is a flowchart illustrating a method of producing a pulse pair sequence in accordance with the present technology.

Referring now to FIG. 2, a flowchart of the design path used to develop a semi-adiabatic multi slice (SEAMS) power independent of number of slices (PINS) sequence is illustrated. In step 200, the MRI computing device 12 generates a control signal for the waveform generator 14 to generate an adiabatic radiofrequency pulse, although other types and numbers of radiofrequency pulses may be generated using the MRI computing device 12.

The control signal to produce the adiabatic radiofrequency pulse is generated using the Shinnar Le-Roux (SLR) algorithm as described in Pauly et al., "Parameter Relations for the Shinnar-Le Roux Selective Excitation Pulse Design Algorithm [NMR imaging]," *IEEE Trans Med Imaging* 10(1):53-65 (1991) and Balchandani et al., "Designing Adiabatic Radio Frequency Pulses Using the Shinnar-Le Roux Algorithm," *Magn Reson Med* 64(3):843-851 (2010), the disclosures of which are hereby incorporated by reference herein in their entirety, although other methods may be utilized. In this example, the adiabatic pulse is a 180° pulse with a bandwidth of 1.11 kHz, a duration of 7 ms, and peak RF amplitude of 17 µT, although other adiabatic pulses having other parameters may be utilized.

The frequency profile of the adiabatic 180° pulse is the response of a least-squares linear-phase filter set to have the desired bandwidth. In order to introduce adiabatic behavior and distribute RF energy more uniformly, quadratic phase may be applied across the frequency response for the filter as described in Balchandani et al., "Designing Adiabatic Radio Frequency Pulses Using the Shinnar-Le Roux Algorithm," *Magn Reson Med* 64(3):843-851 (2010), which is hereby incorporated by reference herein in its entirety. According to one example, the $B_{180}(z)$ polynomial may then calculated as the Fourier transform of the resultant frequency profile and a minimum-phase $A_{180}(z)$ polynomial may be calculated from the $B_{180}(z)$ polynomial. The $A_{180}(z)$ and $B_{180}(z)$ polynomials may be used as inputs for the inverse SLR transform to produce an RF pulse waveform which was truncated to a duration of 7 ms.

Next, in step 202 the MRI computing device 12 generates another control signal for the waveform generator 14 to produce non-adiabatic matched-phase pulse corresponding to the adiabatic pulse. In one example the control signal to produce the non-adiabatic matched-phase pulse is generated as described in Balchandani et al., "Self-refocused Adiabatic Pulse for Spin Echo Imaging at 7 T,". *Magn Reson Med* 67(4):1077-1085 (2012) to form a semi-adiabatic pulse pair, although other methods may be utilized for generating the matched-phase adiabatic pulse. In this example, the non-adiabatic matched phase pulse is a 90° pulse, which compensates the nonlinear quadratic phase deposited by the 180° pulse, but is inherently not adiabatic. To obtain the complementary phase in the excitation pulse, the $B_{90}(z)$ polynomial may be calculated from the $B_{180}(z)$ polynomial using Equation 1.

$$\beta_{90} = \frac{1}{\sqrt{2}} \beta_{180}^2 \qquad (1)$$

The $A_{90}(z)$ polynomial may then be calculated from the $B_{90}(z)$ and both polynomials set as inputs to the inverse SLR transform to generate the matched-phase 90° pulse. In one example, the pulse duration of the 90° pulse is set to be equivalent to the 180° pulse, as described in Park et al., "Spin-echo MRI Using Pi/2 and Pi Hyperbolic Secant Pulses," *Magn Reson Med* 61(1):175-187 (2009). The 180 degree adiabatic pulse and the matched phase 90 degree pulse form a matched phase semi-adiabatic pulse pair.

Next, in step 204 the MRI computing device 12 transforms the control signal for the generated adiabatic pulse to form a power independent of number of slices (PINS) pulse control signal. The adiabatic PINS 180° refocusing pulse is created, by way of example, by sampling the adiabatic SLR 180° pulse utilizing a comb function, although other sampling techniques may be utilized. The comb function creates evenly spaced nulls in the pulse waveform interleaved between RF pulse samples or lobes. The number of lobes in the 180° pulse (n) may be calculated using Equation 2 set forth below to achieve a slice thickness ratio between a slice thickness (Th) value and slice separation (S) value, given the refocusing pulse bandwidth (BW) and RF pulse duration ($t_{rf}$). In one example, the first slice thickness ratio is approximately ~⅛, although other slice thickness ratios may be utilized.

$$n = BW \times t_{rf} \times \left(\frac{S}{Th}\right) \quad (2)$$

Figures 3A, 3B, 3C, 3D, 3E, 3F:
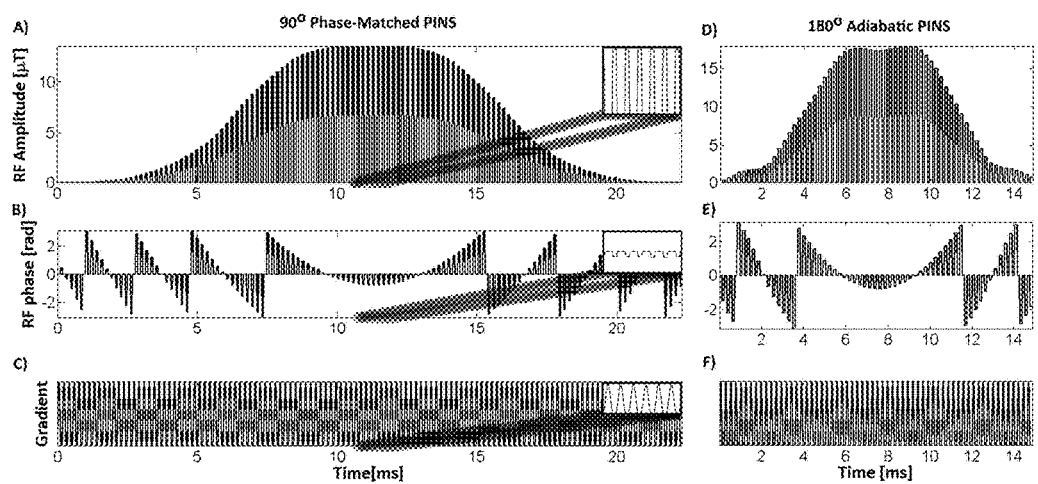
FIG. 3A-3F illustrate aspects of a SEAMS PINS pulse-pair including the amplitude of the SEAMS PINS RF waveform for matched-phase excitation pulse (FIG. 3A) and refocusing pulse (FIG. 3D), associated phase for the excitation pulse (FIG. 3B) and refocusing pulses (FIG. 3E), and Gradient waveforms timed to coincide with the nulls in the RF pulses (FIGS. 3C and 3F). The insets in A, B, and C show the details of a 1 ms section of the waveforms.

The magnitude and phase for a sampled adiabatic 180 degree 14 ms ($t_{rf}$=7 ms), 62-lobe pulse, in accordance with an aspect of the present technology, are illustrated in FIGS. 3D and 3E, respectively.

In step 206, the MRI computing device may sample the non-adiabatic matched phase pulse based on the same slice separation and thickness ratio as the adiabatic pulse, although other approaches can be used. In this example, the sampled 90 degree pulse contains 124 equally spaced lobes. The magnitude and phase of the sampled 90 degree pulse are illustrated in FIGS. 3A and 3B, respectively.

In this example, the sampling described transforms the matched-phased semi-adiabatic pulse-pair control signal into a PINS pulse-pair control signal for the waveform generator 14. The total time (including the gradient lobes) of the 180 degree adiabatic excitation pulse is 50% longer than the total duration of the spin echo 90 degree refocusing pulse in order to adhere to peripheral nerve stimulation (PNS) system limits. The 180 degree adiabatic excitation pulse consists of twice as many lobes as the 90 degree refocusing pulse, however each RF lobe is ½ the duration, resulting in a total of 7 ms of RF sampling for both pulses.

Next, in step 208 the MRI computing device generates control signals for the waveform generator 14 for gradient pulses corresponding to the adiabatic PINS pulse and the matched phase non-adiabatic pulse. The RF nulls are the same duration for both the adiabatic excitation pulse and the matched phase refocusing pulse. Thus the gradient lobe amplitude, as illustrated in FIG. 3C, played with the adiabatic excitation pulse are identical to the gradient lobes used during the matched phase refocusing pulse, as illustrated in FIG. 3F. The final adiabatic excitation pulse may be 21 ms in total duration including 14 ms of null time to play gradients and 7 ms of RF sampling.

The gradient pulse trains, for both the adiabatic excitation pulse (FIG. 3C) and the matched phase refocusing pulse (FIG. 3F) interleave within the nulls of the PINS pulses generated by the sampling techniques as described above in steps 204 and 206. The time-integral of each gradient lobe (A) is given in Equation 3 where G(t) is the gradient amplitude and τ is the duration of the gradient lobe. In order to maximize the gradient amplitude for a fixed small τ and typical maximum gradient slew rate on human scanners, each gradient lobe may be triangular, with a maximum amplitude Gamp.

$$A = \int_{t_o}^{t_o+\tau} G(t)dt = \frac{1}{2}G\tau \quad (3)$$

Thus, the separation between the slices can be calculated using Equation 4 where γ is the gyromagnetic ratio.

$$S = \frac{2}{\frac{\gamma}{\tau\pi}G\tau} \quad (4)$$

Next, in step 210, the MRI computing device 12 outputs the completed SEAMS PINS pulse-pair control signal and associated gradient train to the waveform generator 14 to be inserted into a spin echo pulse sequence, replacing the conventional excitation and refocusing pulses, to create the SEAMS PINS sequence using the MRI device 16 using known techniques. The pulse-pair may be integrated into any sequence that uses a single spin-echo, such as diffusion MRI or spin echo functional MRI sequences at high field strengths.

The spin echo sequence may then be utilized, in step 212, to generate an MRI image using known MRI techniques. By way of example, the image may be a structural image, a diffusion weighted image, or a functional image. The SEAMS PINS sequence is capable of producing separable multi-slice spin echo profile with improved immunity to $B_1$ variation when compared to conventional spin echo sequences.

Pulse BW and sampling rate, as well as gradient amplitude and duty cycle can be manipulated in order to adjust slice thickness and slice separation achieved by the SEAMS PINS pulse-pair. For the same gradient pulse shape and amplitude, decreasing the pulse BW alters the ratio of slice thickness to slice separation, resulting in thinner slices separated by the same distance.

In one example, the SEAMS PINS sequence utilizes a phase-matched 90°-180° pulse-pair to achieve a minimum TE of 40 ms. The TE may be shortened further by using a shorter 90° pulse which is still designed to unwind the phase of the 180° pulse. Shortening the 90° pulse can also be accomplished through shorter nulls with a corresponding increase in the gradient slew rate maximum in order to achieve the same slice thickness.

In one example, to reconstruct the aliased images, a set of weighting factors, corresponding to the individual coil sensitivities for each slice position in the MRI device may need to be calculated. In order to calculate this weighting, a low resolution (64×64) data set may be acquired over the entire volume. For reconstruction, the raw data from each coil was retrieved and combined with the weighting factors, and a slice-GRAPPA MATLAB (The Mathworks Inc., Natick, Mass., USA) script as described in Moeller et al., "Multiband Multislice GE-EPI at 7 Tesla, With 16-fold Acceleration Using Partial Parallel Imaging With Application to High Spatial and Temporal Whole-Brain fMRI," *Magn Reson Med* 63(5):1144-1153 (2010) and Setsompop et al., "Blipped-Controlled Aliasing in Parallel Imaging for Simultaneous Multislice Echo Planar Imaging With Reduced G-Factor Penalty," *Magn Reson Med* 67(5):1210-1224 (2012), the disclosures of which are hereby incorporated herein by reference in their entirety, may be modified to calculate the weights and un-alias the overlapping signals into individual separated slices.

Successful separation of the multiple slices may be performed using a conventional readout. However, these pulses may be used to excite and separate more closely spaced slices by introducing inter-slice image shifts in the phase encoding direction using the CAIPIRINHA technique as disclosed in Breuer et al., "Controlled Aliasing in Parallel Imaging Results in Higher Acceleration (CAIPIRINHA) for Multi-slice Imaging," *Magn Reson Med* 53(3):684-691 (2005), the disclosure of which is incorporated herein by reference in its entirety.

EXAMPLES

The following examples are merely intended to illustrate practice of examples of the invention, and are not intended to limit the scope of the claimed invention.

Simulations as well as phantom and in vivo results, demonstrate multi-slice capability and improved $B_1$-insensitivity of the SEAMS PINS pulse-pair when operating at RF amplitudes of up to 40% above adiabatic threshold.

Therefore, an ODF of 1.5 would mean a 50% increase of pulse amplitude above the adiabatic threshold. Maximum magnetization for the center slice was compared to a conventional non-adiabatic spin echo pulse-pair for the same range of ODFs. In the case of the conventional spin echo, ODF was calculated as the ratio of the applied RF pulse amplitude to the nominal RF pulse amplitude (i.e. the amplitude at which the pulse was designed to operate to achieve a flip angle of 180°).

TABLE 1

Pulse sequence parameters for the reference scan and SEAMS PINS image acquisition for in vivo and phantom scans

| Sequence | TR [ms] | $N_{av}$ | TE [ms] | FOV [mm × mm] | Matrix | Gradient [mT/m] | Thickness [mm] | Total Time [min:sec] |
|---|---|---|---|---|---|---|---|---|
| Phantom Reference | 8.6 | 1 | 4 | 250 × 250 | 64 × 64 | N/A | 5 | 0:28 |
| Phantom PINS | 300 | 2 | 43 | 250 × 250 | 512 × 512 | 10.4 | 5 | 2:52 |
| Human Reference | 8.6 | 1 | 4 | 240 × 240 | 64 × 64 | N/A | 5 | 0:27 |
| Human PINS | 300 | 4 | 43 | 240 × 240 | 256 × 256 | 10.4 | 5 | 5:20 |

Methodology

The frequency responses of the APINS(z) and BPINS(z) polynomials were simulated for the final SEAMS PINS pulse-pair and used to calculate the spin echo magnetization profile as given in Equations 5-7.

$$M_{xy} = 2\text{conj}(A_{PINS90}(z)) * B_{PINS90}(z) \quad (5)$$

$$M_{ref} = B_{PINS180}(z) * B_{PINS180}(z) \quad (6)$$

$$M_{fin} = \text{conj}(M_{xy}) M_{ref} \quad (7)$$

Where $M_{xy}$ is the transverse magnetization after the initial excitation by the matched-phase 90 degree PINS pulse and $M_{ref}$ is the refocusing profile for the adiabatic PINS 180 degree pulse. The final magnetization ($M_{fin}$) at the spin echo can be calculated as the effect of the 180 degree pulse on the transverse magnetization produced by the 90 degree pulse (Equation 7), as described in Pauly et al., "Parameter Relations for the Shinnar-Le Roux Selective Excitation Pulse Design Algorithm [NMR imaging]," *IEEE Trans Med Imaging* 10(1):53-65 (1991), the disclosure of which is incorporated herein by reference in its entirety.

Figures 4A, 4B, 4C, 4D:
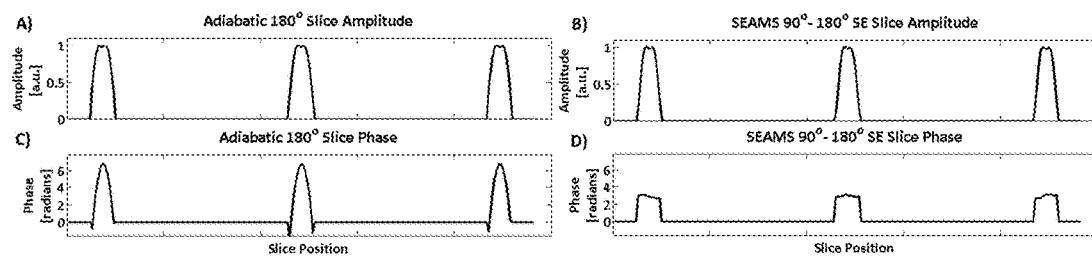
FIG. 4A-4D illustrate slice profiles for a 180 degree adiabatic PINS pulse and a final spin echo at three different slice positions including the amplitude (FIG. 4A) and phase (FIG. 4C) of a multi-slice profile produced by the 180° adiabatic PINS pulse and the amplitude (FIG. 4B) phase (FIG. 4D) of a spin echo generated by the matched-phase adiabatic PINS pulse-pair.

The multi-slice magnitude and phase profiles of the adiabatic PINS refocusing pulse, obtained using Equation 6, are shown in FIGS. 4A and 4C. The magnitude and phase of the multi-slice spin echo profile obtained using Equation 7 are shown in FIGS. 4B and 4D. The nearly flat phase obtained across the slices in the final spin echo, after the application of the linear refocusing slice gradient, demonstrates that the quadratic phase is largely refocused in the final spin echo. This phase-matching obviates the need for a second adiabatic refocusing pulse that might otherwise be required to cancel non-linear phase.

The B1-insensitivity of the SEAMS PINS pulse-pair was investigated by simulating the spin echo profile (using Equation 7) for RF overdrive factors ranging from 0.5 to 1.5, in increments of 0.1. The RF overdrive factor (ODF), given in Equation 8, is a way of measuring the sequence response to a degree of B1-inhomogeneity. ODF is equal to the RF amplitude of the applied pulse ($P_{app}$) divided by the RF amplitude of the pulse at adiabatic threshold ($Pt_{hresh}$).

$$ODF = \frac{P_{app}}{P_{thresh}} \quad (8)$$

Example 1: Phantom Images Using Semi-Adiabatic Power Independent of Number of Slices Pulse Pair The performance of the SEAMS PINS pulse-pair was verified in a cylindrical water phantom (water bottle) and a spherical water phantom. All experiments were performed on a 7T actively shielded whole body MRI scanner (Siemens MAGNETOM 7T, Siemens, Erlangen), equipped with a SC72CD gradient coil (Gmax=70 mT/m and max slew rate=200 T/m/s), using a single channel transmitter and a 32-channel receive head coil (Nova Medical, Wilmington, Mass.). Pulse sequence parameters for the phantom experiments are summarized in Table 1.

The slice-selectivity and B1-insensitivity of the pulse sequence were tested on a cylindrical water phantom (created using a water bottle) by applying the SEAMS PINS sequence with the readout gradient played along the slice-select (axial) direction. This made it possible to obtain a projection through the multi-slice profile. We then applied the SEAMS PINS sequence with the RF pulses powered at ODF=0.5-1.5 in steps of 0.1, in order to determine whether the measured B1-insensitivity of the multi-slice profile agreed with simulated behavior.

Phantom experiments on a spherical water phantom were conducted to demonstrate in-plane slice behavior for a range of B1 values as well as successful separation of overlapping slices. The SEAMS PINS sequence was powered with ODF=0.5, 1.0, 1.1, 1.2, 1.3, 1.4, 1.5, and 2.0. The readout gradient was played out in the conventional way, perpendicular to both the phase-encode and the slice-select gradients. The resulting aliased images were separated using the weightings calculated from a low resolution reference scan of the volume. A 10.4 mT/m gradient was used with a SEAMS PINS sequence designed to obtain a ⅛ slice separation ratio for 5 mm thick slices, resulting in a slice separation of 40 mm. In the spherical phantom with 18 cm diameter, this produced 4 slices across the field of view.

Results—Example 1

FIG. 5 compares the data from the cylindrical water phantom, scanned with increasing RF power, to the simulated magnetization profiles for SEAMS PINS. The magnitude of the projection through the multi-slice profile for a range RF overdrive factors is plotted in FIG. 5.

Figures 5A, 5B, 5C:
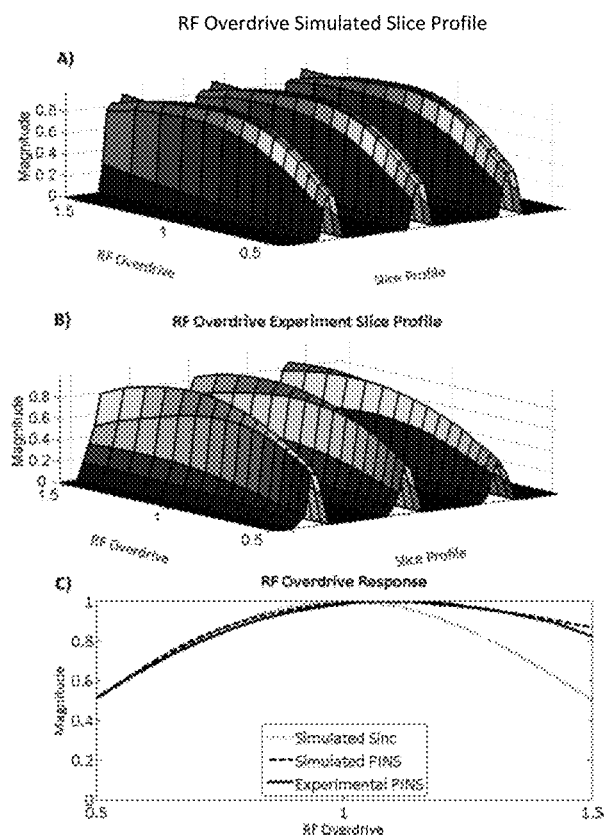
FIGS. 5A-C illustrate behavior of simulated slice profiles and measured slice profiles in a phantom as RF amplitude is varied for SEAMS PINS including a simulation of the multi-slice pulse profile (FIG. 5A), a central cross-section of the slices measured from imaging a cylindrical water phantom plotted for ODFs ranging from 0.5 to 1.5 (FIG. 5B, and simulated and measured phantom slice profile amplitudes obtained using the SEAMS PINS sequence compared with simulated slice profile amplitudes obtained using a conventional non-adiabatic spin echo sequence (FIG. 5C).

FIG. 5A shows the simulated slice profile and FIG. 5B shows the measured slice profile in the cylindrical phantom experiment. In both figures, the slice parameters and position of the projection through the slices remain fixed. As expected, the amplitude of the selected slices increases as the angle of the excitation pulse approaches 90 degrees and the spin echo refocusing pulse approaches adiabatic threshold (i.e. ODF=1). Past the adiabatic threshold for the refocusing pulse, magnetization declines at a much slower rate owing to the B1-insensitive behavior of the 180 degree pulse. Some loss of amplitude of the magnetization occurs due to the non-adiabatic behavior of the excitation pulse.

FIG. 5C compares the slice magnitude of a conventional windowed 90°-180° spin echo pulse-pair to the simulated and experimental center slice magnitude in images produced by the SEAMS PINS pulse-pair, for a range of RF overdrive factors. Although there is some loss of slice signal as RF is overdriven above adiabatic threshold (ODF=1) due to the non-adiabatic behavior of the 90° pulse, the SEAMS PINS pulse-pair still achieves much slower signal decay than the conventional spin echo, due to the B1-immunity imparted by the adiabatic 180° PINS pulse.

FIG. 6 illustrates the slice selection (profile of axial slices) of the SEAMS PINS sequence in a phantom.

Figures 6A, 6B, 6C:
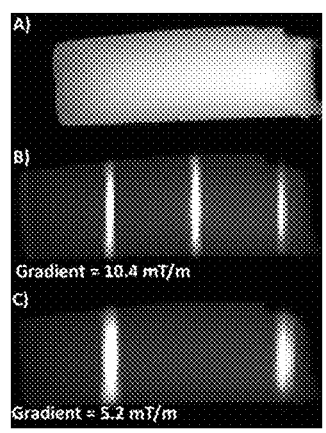
FIGS. 6A-6C illustrate slice profiles in cylindrical water phantom. The projection of the slice profile obtained by acquiring the readout direction parallel to the slice-select direction is overlaid on a conventionally acquired coronal image of the phantom (FIG. 6A). The slice profiles were acquired using gradient amplitudes of 10.4 mT/m—resulting in three 5 mm slices separated by 40 mm (FIG. 6B) and 5.2 mT/m—resulting in two 10 mm slices separated by 80 mm (FIG. 6C).

FIG. 6A shows a coronal slice of a cylindrical water phantom. FIG. 6B shows the multiple slice profiles obtained by using the SEAMS PINS sequence with the readout gradient in the slice-select direction. The slices shown in FIG. 6B were 5 mm thick (full width at half maximum) and the separation between the center of each slice was 40 mm, as expected from the pulse design. The SEAMS PINS slice projection has been overlaid on the coronal water bottle slice image to provide a position reference. When the maximum gradient amplitude is decreased from 10.4 mT/m to 5.2 mT/m, the slice thickness and the slice separation increases to 10 mm and 80 mm, respectively (FIG. 6C), although the slice thickness to separation ratio remains constant at ⅛.

Figures 7A, 7B, 7C, 7D, 7E, 7F:
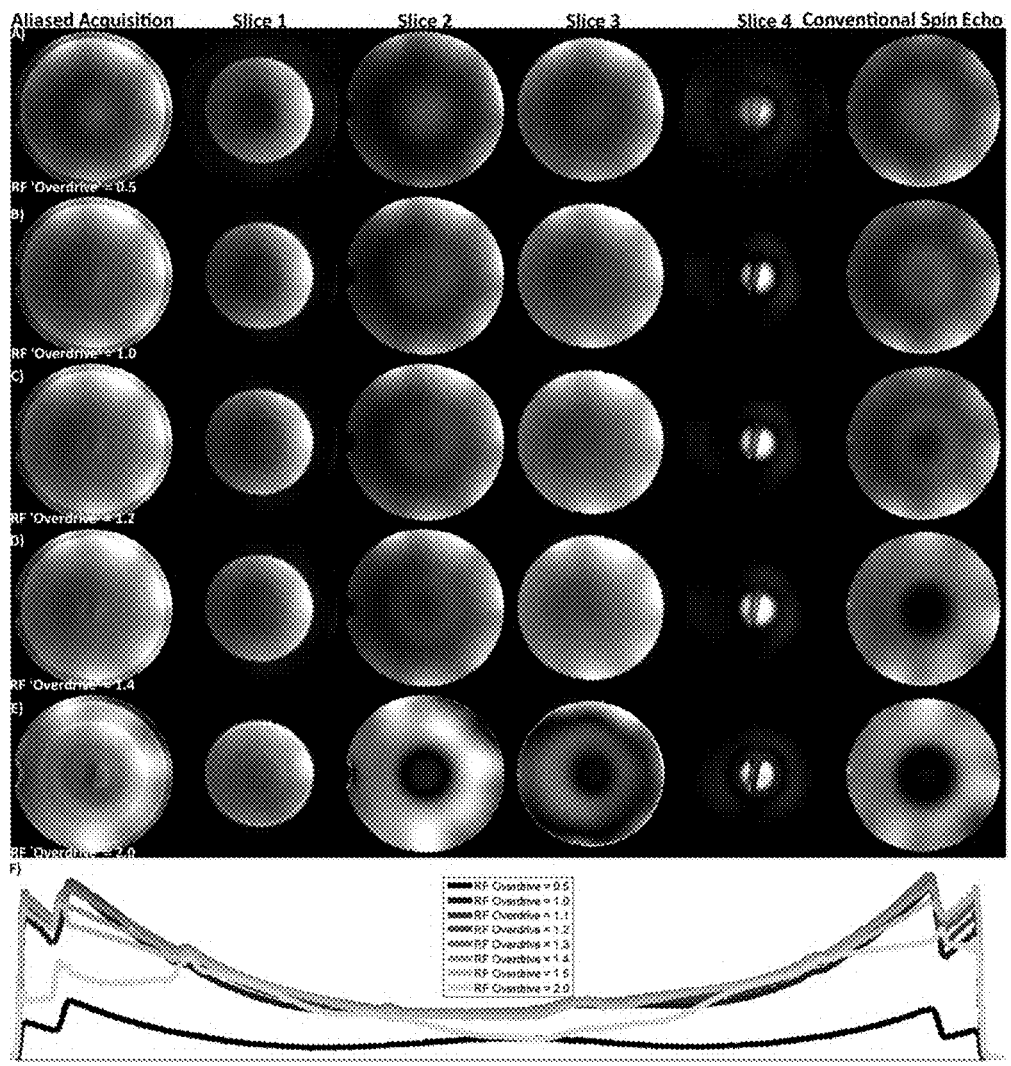
FIGS. 7A-7F illustrate spherical water phantom images at different RF overdrive factors. Multiple overlapping slices obtained using SEAMS PINS (left column), 4 disentangled individual slices obtained from SEAMS PINS image (middle 4 columns), and single central slice obtained using a conventional spin echo sequence (right column) when RF pulse amplitude was set to 50% of adiabatic threshold (ODF=0.5) (FIG. 7A), adiabatic threshold at the center of the sphere (ODF=1) (FIG. 7B), 20% above adiabatic threshold (ODF=1.2) (FIG. 7C); 40% above adiabatic threshold (ODF=1.4) (FIG. 7D); and 100% above adiabatic threshold (ODF=2) (FIG. 7E). Central cross sections of slice 2 of the SEAMS PINS phantom images obtained at ODFs ranging from 0.5 to 2 are illustrated in FIG. 7F.

The B1-insensitivity of the SEAMS PINS sequence was explored through experiments on a spherical water phantom (FIG. 7). When the RF excitation and refocusing pulses were underpowered (FIG. 7A, ODF=0.5), the un-aliased image quality is poor, as expected.

FIG. 7B illustrates an image acquired with the RF amplitude set to achieve adiabatic threshold at the center of the spherical phantom, while FIGS. 7C and 7D illustrate the images acquired with an increase in RF amplitude of 20% and 40%, respectively (ODF=1.2 and 1.4).

As shown in FIG. 7E, significant image degradation occurs with an ODF of 2.0 due to the non-adiabatic behavior of the 90 degree pulse and deterioration of phase-matching as the pulse-pair is overdriven. However, for a range of RF overdrive (up to 40%) images remain largely invariant, especially when compared to the center slice obtained through a conventional spin echo acquisition for the same range of ODFs (FIG. 7, right column). This demonstrates the robust behavior of the SEAMS PINS pulse-pair in the presence of the B1 variation typically observed in vivo at 7T.

FIG. 7F plots the central line projection through images obtained at the range of tested RF overdrive values. The semi-adiabatic behavior of the SEAMS PINS sequence in the spherical phantom is consistent with simulated and measured values in the cylindrical water phantom.

Example 2: In Vivo Images Using Semi-Adiabatic Power Independent of Number of Slices Pulse Pair The SEAMS PINS sequence was used to scan the brain of a healthy human volunteer. Institutional Review Board approval and informed consent were obtained prior to scanning. The in vivo images were acquired with the same sequence parameters as the phantom images, but with a FOV of 240 mm×240 mm. A 10.4 mT/m gradient was used with the slice thickness of 5 mm and a slice separation of 40 mm. To measure B1-insensitivity of SEAMS PINS, images were acquired with ODF=1.0, 1.1, 1.2, 1.4, and 1.6. The acquisition parameters for these scans are summarized in Table 1 set forth above. The SNR was measured on the in vivo image as the mean signal acquired from 225 pixels divided by the standard deviation of the noise signal, acquired from 225 pixels in a non-image region.

Results—Example 2

Figures 8A, 8B, 8C, 8D, 8E, 8F:
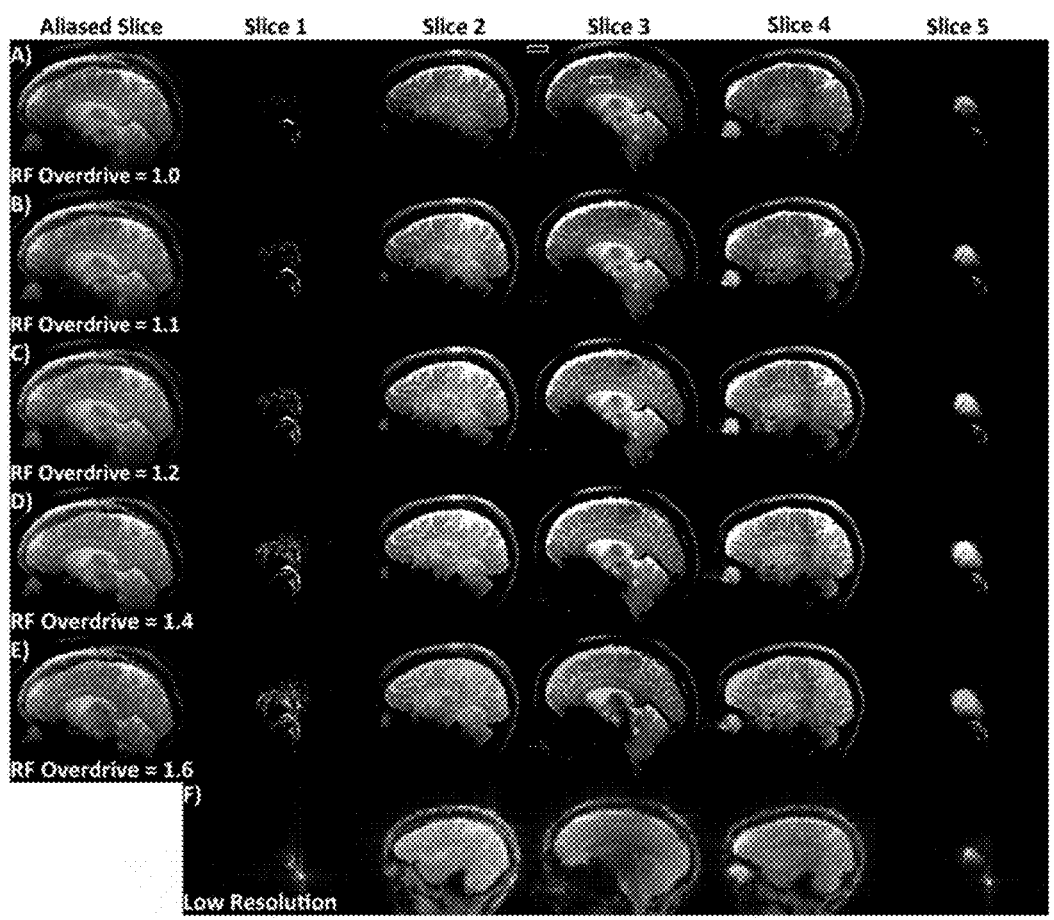
FIGS. 8A-8F illustrate reconstructed multiple sagittal human brain images acquired using the SEAMS PINS sequence. Aliased slice (left column) and individual un-aliased slices 1-5 (right columns) for an image obtained at adiabatic threshold (FIG. 8A), ODF=1.1 (FIG. 8B), ODF=1.2 (FIG. 8C), ODF=1.4 (FIG. 8D), and ODF=1.6 (FIG. 8E).

In vivo brain images obtained using the SEAMS PINS sequences are shown in FIG. 8. The sum-of-squares images obtained by combining the image data from the 32 receiver coils contains 5 overlapping slices (FIG. 8A-8E, left-most column) are shown for ODFs of 1, 1.1, 1.2, 1.4, and 1.6 in FIGS. 8A-8E. The signal in the brain was measured in the solid white box showed in FIG. 8A, and the noise measurement was taken from the region indicated by the dashed white box. The two measured values were used to compute the SNR. The same measurement, repeated in each image in the ODF experiment resulted in an SNR that ranged from a high of 48 (ODF=1.2), to a low of 34 (ODF=1.6). The SNR for ODF=1.0, 1.1, and 1.4 were 42, 46, and 43, respectively. The slices were disentangled using the low resolution reference scans (FIG. 8F), into 5 separate slices (FIG. 8, remaining columns).

The SEAMS PINS sequence is capable of producing separable multi-slice spin echo profile with improved immunity to B1 variation when compared to conventional spin echo sequences. Simulations show that for a conventional spin echo, a 20% percent increase in B1 results in more than 10% signal loss; in the SEAMS sequence, an increase of 41% is required to see the same level of loss. Phantom data and in vivo experiments showed that the SEAMS PINS pulse sequence provides improved B1-insensitivity when compared to the traditional spin echo and resulted in minimal image quality variations over a 40% increase in transmit B1, making it a valuable pulse-pair for high-field sequences. FIG. 4 illustrates the window of B1-insensitivity of the SEAMS PINS sequence.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order.

What is claimed is:

1. A method for generating a magnetic resonance image, the method comprising:
generating, by a magnetic resonance imaging computing device, a pulse pair control signal comprising an adiabatic pulse and a matched phase non-adiabatic pulse;
transforming, by the magnetic resonance imaging computing device, the pulse pair control signal into a power independent of number of slices pulse pair control signal comprising a power independent of number of slices adiabatic pulse and a power independent of number of slices matched phase non-adiabatic pulse;

outputting, by the magnetic resonance imaging computing device, the power independent of number of slices pulse pair control signal to a waveform generator to produce the power independent of number of slices pulse pair in a spin echo sequence; and generating, by the magnetic resonance imaging computing device, a magnetic resonance image based on the power independent of number of slices pulse pair.

2. The method as set forth in claim 1, wherein the adiabatic pulse comprises a 180 degree adiabatic pulse and the matched phase non-adiabatic pulse comprises a 90 degree pulse.

3. The method as set forth in claim 1, wherein the transforming further comprises:

sampling, by the magnetic resonance imaging computing device, the adiabatic pulse based on a first slice thickness to slice separation ratio; and sampling, by the magnetic resonance imaging computing device, the matched phase pulse based on the first slice thickness to slice separation ratio.

4. The method as set forth in claim 3, wherein the first slice thickness to slice separation ratio is about one-eighth.

5. The method as set forth in claim 3, wherein the sampling comprises utilizing a comb function.

6. The method as set forth in claim 1 further comprising:

generating, by the magnetic resonance imaging computing device, a gradient pulse control signal for each of the sampled adiabatic pulse and the sampled matched phase pulse; and outputting, by the magnetic resonance imaging computing device, the gradient pulse control signals to the waveform generator to produce the gradient pulses.

7. The method as set forth in claim 6, wherein the gradient pulse control signals are configured to be capable of causing the waveform generator to interleave the gradient pulses with corresponding nulls in the power independent of number of slices pulse pair.

8. The method as set forth in claim 6 further comprising:

generating, by the magnetic resonance imaging computing device, the magnetic resonance image based on the power independent of number of slices pulse pair and the gradient pulses.

9. The method as set forth in claim 8, wherein the magnetic resonance image comprises a structural image, a diffusion weighted image, or a functional image.

10. The method as set forth in claim 1, wherein the adiabatic pulse comprises a bandwidth of about 1.11 kHz, a duration of 7 ms, and a peak radiofrequency amplitude of 17 µT.

11. The method as set forth in claim 1, wherein a pulse duration of the adiabatic pulse is equal to the pulse duration of the matched phase pulse.

12. The method as set forth in claim 1, wherein the pulse pair is semi-adiabatic.

13. A magnetic resonance imaging computing device comprising:

at least one processor;

and a memory coupled to the processor which is configured to be capable of executing programmed instructions comprising and stored in the memory to:

generate a pulse pair control signal comprising an adiabatic pulse and a matched phase non-adiabatic pulse;

transform the pulse pair control signal into a power independent of number of slices pulse pair comprising a power independent of number of slices adiabatic pulse and a power independent of number of slices matched phase non-adiabatic pulse;

output the power independent of number of slices pulse pair control signal to a waveform generator to produce the power independent of number of slices pulse pair in a spin echo sequence; and generate a magnetic resonance image based on the power independent of number of slices pulse pair.

14. The device as set forth in claim 13, wherein the adiabatic pulse comprises a 180 degree adiabatic pulse and the matched phase non-adiabatic pulse comprises a 90 degree pulse.

15. The method as set forth in claim 13, wherein the processor coupled to the memory is further configured to be capable of executing at least one additional programmed instruction to:

sample the adiabatic pulse based on a first slice thickness to slice separation ratio; and sample the matched phase pulse based on the first slice thickness to slice separation ratio.

16. The device as set forth in claim 15, wherein the first slice thickness to slice separation ratio is about one-eighth.

17. The device as set forth in claim 15, wherein the sampling comprises utilizing a comb function.

18. The device as set forth in claim 13, wherein the processor coupled to the memory is further configured to be capable of executing at least one additional programmed instruction to:

generate a gradient pulse control signal for each of the sampled adiabatic pulse and the sampled matched phase pulse; and output the generated gradient pulse control signals to the waveform generator to produce gradient pulses.

19. The device as set forth in claim 18, wherein the gradient pulse control signals are configured to be capable of causing the waveform generator to interleave the gradient pulses with corresponding nulls in the power independent of number of slices pulse pair.

20. The device as set forth in claim 18, wherein the processor coupled to the memory is further configured to be capable of executing at least one additional programmed instruction to:

generate the magnetic resonance image based on the power independent of number of slices pulse pair and the gradient pulses.

21. The device as set forth in claim 20, wherein the magnetic resonance image comprises a structural image, a diffusion weighted image, or a functional image.

22. The device as set forth in claim 13, wherein the adiabatic pulse comprises a bandwidth of about 1.11 kHz, a duration of 7 ms, and a peak radiofrequency amplitude of 17 µT.

23. The device as set forth in claim 13, wherein a pulse duration of the adiabatic pulse is equal to the pulse duration of the matched phase pulse.

24. The device as set forth in claim 13, wherein the pulse pair is semi-adiabatic.

25. A non-transitory computer readable medium having stored thereon instructions for generating a magnetic resonance image comprising executable code which when executed by a processor, causes the processor to perform steps comprising:

generating a pulse pair control signal comprising an adiabatic pulse and a matched phase non-adiabatic pulse;

transforming the pulse pair control signal into a power independent of number of slices pulse pair control signal comprising a power independent of number of slices adiabatic pulse and a power independent of number of slices matched phase non-adiabatic pulse;

outputting the power independent of number of slices pulse pair control signal to a waveform generator to produce the power independent of number of slices pulse pair in a spin echo sequence; and generating a magnetic resonance image based on the power independent of number of slices pulse pair.

26. The medium as set forth in claim 25, wherein the adiabatic pulse comprises a 180 degree adiabatic pulse and the matched phase non-adiabatic pulse comprises a 90 degree pulse.

27. The medium as set forth in claim 25, wherein the transforming further comprises:

sampling the adiabatic pulse based on a first slice thickness to slice separation ratio; and sampling the matched phase pulse based on the first slice thickness to slice separation ratio.

28. The medium as set forth in claim 27, wherein the first slice thickness to slice separation ratio is about one-eighth.

29. The medium as set forth in claim 27, wherein the sampling comprises utilizing a comb function.

30. The medium as set forth in claim 25 further comprising:

generating a gradient pulse control signal for each of the sampled adiabatic pulse and the sampled matched phase pulse; and outputting the gradient pulse control signal to the waveform generator to produce gradient pulses.

31. The medium as set forth in claim 30, wherein the gradient pulse control signals are configured to be capable of causing the waveform generator to interleave the gradient pulses with corresponding nulls in the power independent of number of slices pulse pair.

32. The medium as set forth in claim 31 further comprising:

generating the magnetic resonance image based on the power independent of number of slices pulse pair and the gradient pulses.

33. The medium as set forth in claim 32, wherein the magnetic resonance image comprises a structural image, a diffusion weighted image, or a functional image.

34. The medium as set forth in claim 25, wherein the adiabatic pulse comprises a bandwidth of about 1.11 kHz, a duration of 7 ms, and a peak radiofrequency amplitude of 17 $\mu$T.

35. The medium as set forth in claim 25, wherein a pulse duration of the adiabatic pulse is equal to the pulse duration of the matched phase pulse.

36. The medium as set forth in claim 25, wherein the pulse pair is semi-adiabatic.

* * * * *